(12) United States Patent
Miyazaki et al.

(10) Patent No.: US 9,659,870 B2
(45) Date of Patent: May 23, 2017

(54) WIRING AND METHOD FOR MANUFACTURING THE SAME

(71) Applicant: Kabushiki Kaisha Toshiba, Minato-ku (JP)

(72) Inventors: Hisao Miyazaki, Yokohama (JP); Tadashi Sakai, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/842,239

(22) Filed: Sep. 1, 2015

(65) Prior Publication Data

US 2016/0086890 A1 Mar. 24, 2016

(30) Foreign Application Priority Data

Sep. 18, 2014 (JP) .................. 2014-190565

(51) Int. Cl.
- *H01L 23/532* (2006.01)
- *H01L 51/00* (2006.01)
- *H01L 21/768* (2006.01)
- *H01L 23/528* (2006.01)

(52) U.S. Cl.
CPC .. *H01L 23/53276* (2013.01); *H01L 21/76834* (2013.01); *H01L 21/76838* (2013.01); *H01L 2924/0002* (2013.01)

(58) Field of Classification Search
CPC ..................... H01L 23/53276; H01L 21/76838
USPC .......................................................... 257/750
See application file for complete search history.

(56) References Cited

U.S. PATENT DOCUMENTS

| | | | |
|---|---|---|---|
| 8,871,483 B1 * | 10/2014 | Atanassov | C12N 9/0006 435/181 |
| 9,000,591 B2 | 4/2015 | Yamazaki et al. | |
| 9,117,823 B2 | 8/2015 | Yamazaki et al. | |
| 2011/0006425 A1 | 1/2011 | Wada et al. | |
| 2011/0084252 A1 * | 4/2011 | Wu | B82Y 30/00 257/40 |
| 2011/0101528 A1 | 5/2011 | Akimoto et al. | |
| 2011/0257406 A1 | 10/2011 | Jacques et al. | |
| 2012/0080661 A1 | 4/2012 | Saito et al. | |
| 2012/0080796 A1 | 4/2012 | Wada et al. | |
| 2012/0205626 A1 | 8/2012 | Dimitrakopoulos et al. | |
| 2012/0228614 A1 | 9/2012 | Kitamura et al. | |

(Continued)

FOREIGN PATENT DOCUMENTS

| | | |
|---|---|---|
| JP | 2011-23420 | 2/2011 |
| JP | 2011-96980 | 5/2011 |

(Continued)

OTHER PUBLICATIONS

U.S. Appl. No. 14/842,249, filed Sep. 1, 2015, Miyazaki, et al.

(Continued)

*Primary Examiner* — Moazzam Hossain
(74) *Attorney, Agent, or Firm* — Oblon, McClelland, Maier & Neustadt, L.L.P.

(57) ABSTRACT

Wiring comprises a multilayer graphene including graphene sheets, an interlayer substance disposed between layers of the multilayer graphene, and an organic compound layer connected to a side surface of the multilayer graphene. The organic compound layer contains a photoisomerizable organic group connected to the multilayer graphene.

14 Claims, 6 Drawing Sheets

(56) References Cited

U.S. PATENT DOCUMENTS

| | | | |
|---|---|---|---|
| 2013/0180581 A1* | 7/2013 | Choi | B32B 9/04 |
| | | | 136/256 |
| 2014/0045058 A1* | 2/2014 | Zhao | H01M 4/134 |
| | | | 429/211 |
| 2014/0107326 A1* | 4/2014 | Swager | B82Y 30/00 |
| | | | 534/558 |
| 2014/0145170 A1* | 5/2014 | Li | C01B 31/0484 |
| | | | 257/40 |
| 2014/0145735 A1* | 5/2014 | Koester | G01N 27/227 |
| | | | 324/686 |
| 2014/0231751 A1 | 8/2014 | Wada et al. | |
| 2014/0275597 A1* | 9/2014 | Zhang | C07F 7/1896 |
| | | | 556/418 |
| 2014/0284798 A1 | 9/2014 | Miyazaki et al. | |
| 2014/0284800 A1 | 9/2014 | Miyazaki et al. | |
| 2015/0037530 A1* | 2/2015 | Zhamu | D01F 9/12 |
| | | | 428/113 |
| 2015/0129280 A1* | 5/2015 | Lee | H01B 1/04 |
| | | | 174/126.2 |
| 2015/0194386 A1 | 7/2015 | Yamazaki et al. | |
| 2015/0195897 A1* | 7/2015 | Swift | H05K 1/0203 |
| | | | 361/712 |
| 2015/0248972 A1* | 9/2015 | Tang | B82Y 30/00 |
| | | | 361/502 |

FOREIGN PATENT DOCUMENTS

| | | |
|---|---|---|
| JP | 2011-225573 | 11/2011 |
| JP | 2012-54303 | 3/2012 |
| JP | 2012-80006 | 4/2012 |
| JP | 2012-80014 | 4/2012 |
| JP | 2012-199520 | 10/2012 |
| JP | 2013-58669 | 3/2013 |
| JP | 2013-201373 | 10/2013 |
| JP | 2014-157923 | 8/2014 |
| JP | 2014-183210 | 9/2014 |
| JP | 2014-183212 | 9/2014 |

OTHER PUBLICATIONS

Weekit Sirisaksoontorn et al. "The Effect of Surface Passivation on the Preparation and Stability of the Graphite Intercalation Compounds Containing Tetra-n-alkylammonium Cations", Carbon, vol. 69, 2014, 6 pages.

Xuerong Zhang et al. "Air Stability and Surface Passivation of Acceptor-Type Graphite Intercalation Compounds", Carbon, vol. 38, 2000, 9 pages.

* cited by examiner

WIRING AND METHOD FOR MANUFACTURING THE SAME

CROSS-REFERENCE TO RELATED APPLICATION

This application is based upon and claims the benefit of priority from Japanese Patent Application No. 2014-190565, filed on Sep. 18, 2014; the entire contents of which are incorporated herein by reference.

FIELD

Embodiments described herein relate to a wiring and a method for manufacturing the same.

BACKGROUND

As an LSI or a 3D memory is microfabricated and multilayered, an increase in wiring delay is becoming a large problem in metal wiring. It is important to reduce wiring resistance or a capacity between wires in order to reduce the wiring delay. For example, an application of a low-resistance material such as Cu is practically used in order to reduce resistance of the wiring. However, even in the Cu wiring, there are such problems as reliability degradation due to stress migration or electromigration, an increase in electric resistivity caused by a size effect, and embedding into fine via holes. A wiring material having low resistance and excellent current density resistance is demanded.

As a next-generation wiring material which can be expected to have low resistance and high reliability, application of a carbon-based material such as a carbon nanotube or a graphene is attracting attention. The carbon-based material has excellent physical properties such as high current density resistance, electric conductive characteristics, thermal conductivity, and mechanical strength. Particularly, a wiring structure using a graphene in horizontal interlayer wiring is studied. In order to form graphene wiring, a graphene film uniformly formed on a substrate is processed into a wiring shape, or graphene is grown on a catalyst layer formed into a wiring shape. However, when the graphene wiring is as thin as about 10 nm, resistance may increase due to becoming a semiconductor by a quantum confinement effect of an electron or a scattering effect by an edge.

A promising method for reducing the resistance is an intercalation method. In the intercalation method, an interlayer substance is inserted between graphene sheets, and is converted into a graphene interlayer compound. The inserted interlayer substance donates an electron or a hole to the graphene to reduce the resistance. However, the interlayer substance after being subjected to an intercalation treatment may be leaked.

DETAILED DESCRIPTION

Wiring comprises a multilayer graphene including graphene sheets, an interlayer substance disposed between layers of the multilayer graphene, and an organic compound layer connected to a side surface of the multilayer graphene. The organic compound layer contains a photoisomerizable organic group connected to the multilayer graphene.

A method for manufacturing wiring, comprises forming a multilayer graphene processed into a wiring pattern shape on a substrate, forming an organic compound layer on a side surface of the multilayer graphene in a longitudinal direction, inserting an interlayer substance into the multilayer graphene having the organic compound layer formed therein, and cis-trans isomerizing an organic group in the organic compound layer.

Figure 1:
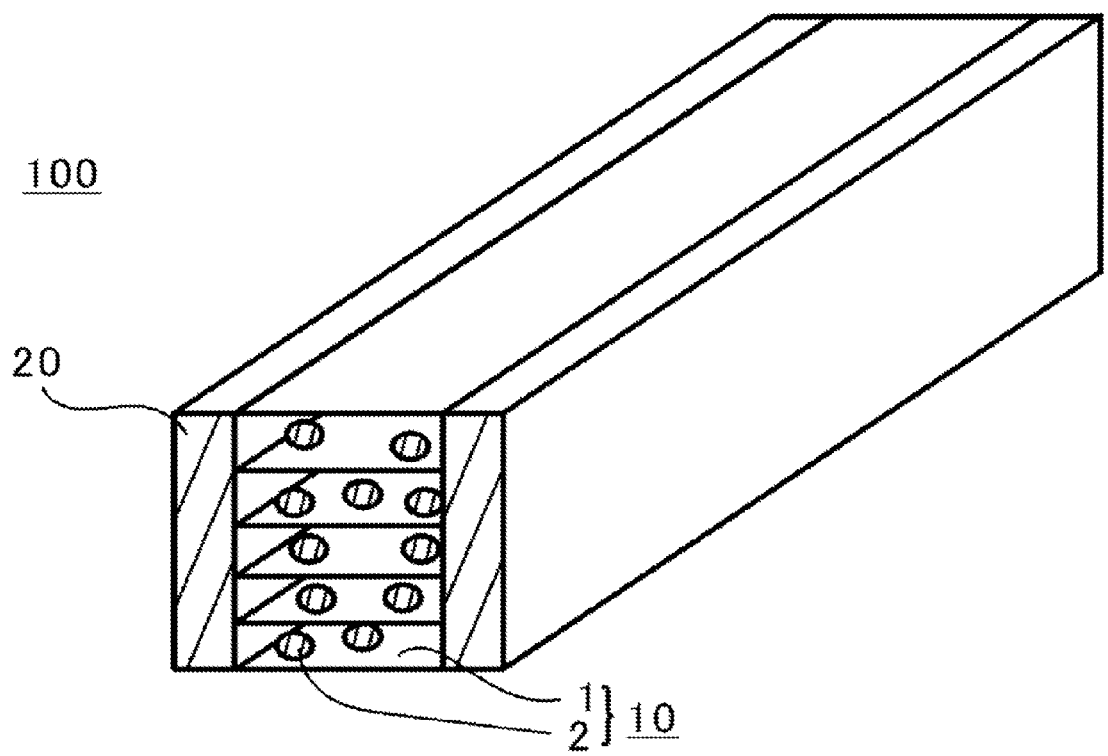
FIG. 1 is a perspective schematic diagram of wiring according to an embodiment.

Hereinafter, wiring according to an embodiment and a method for manufacturing the wiring will be described with reference to the drawings as necessary. The size or the like of each component in the drawings is not necessarily the same as that of the real wiring. FIG. 1 is a perspective diagram of wiring 100 according to the embodiment. The wiring 100 in FIG. 1 includes a graphene interlayer compound 10 and an organic compound layer 20. The graphene interlayer compound 10 includes a multilayer graphene 1 and an interlayer substance 2 disposed between layers of the multilayer graphene 1. The organic compound layer 20 is connected to a side surface of the multilayer graphene 1.

The multilayer graphene 1 includes graphene sheets. The multilayer graphene 1 is a layered substance having planar graphene sheets stacked therein. The graphene sheet of the multilayer graphene 1 is preferably a graphene nanoribbon processed into a wiring pattern shape. The width of the multilayer graphene 1, that is, the wiring width is preferably 3 nm or more and 30 nm or less. The length of the multilayer graphene 1 in a longitudinal direction, that is, the wiring length is any value according to a purpose. The layer number of the multilayer graphene 1 is typically two or more and 100 or less. The wiring width, the wiring length, and the layer number of the multilayer graphene 1 can be checked, for example, with a transmission electron microscope (TEM).

The wiring 100 of the embodiment is used for wiring in a semiconductor device or wiring in an electronic circuit. Specifically, the wiring 100 is used for wiring in a semiconductor device such as an integrated circuit (LSI), a central processing unit (CPU), a programmable logic device (PLD), or a memory chip. For example, an edge of the wiring 100 is connected to an electrode of a transistor or a diode, or is connected to a carbon nanotube of longitudinal wiring via a contact plug. The use form of the wiring 100 of the embodiment is not limited to the above-described forms as long as the wiring 100 is used as a conductor.

The multilayer graphene 1 is not particularly limited as long as the multilayer graphene 1 is processed into a wiring pattern shape. Specifically, the multilayer graphene 1 is obtained, for example, by processing multilayer graphene sheets grown from a catalytic film on a substrate into a wiring pattern shape, by growing a catalytic film processed into a wiring pattern shape on a substrate, by transcribing multilayer graphene sheets processed into a wiring pattern shape onto a substrate of a semiconductor device or the like, by transcribing multilayer graphene sheets onto a substrate of a semiconductor device or the like and then processing the multilayer graphene sheets into a wiring pattern shape, or by processing multilayer graphene sheets into a wiring pattern shape for transcription.

The interlayer substance 2 is included between layers of the multilayer graphene 1. The interlayer substance 2 is an atom or a molecule to donate a carrier (an electron or a hole) to a graphene sheet. The interlayer substance 2 is preferably at least one atom selected from F, Cl, Br, I, O, S, N, P, Li, Na, K, Rb, Cs, Be, Mg, Ca, Sr, Y, Sc, Ba, Eu, Sm, Yb, Hg, and Tl, or a molecule containing at least one thereof. It is possible to use, as the interlayer substance 2, one or more selected from halogen such as $F_2$, $Cl_2$, $Br_2$, or $I_2$, an interhalogen compound such as IBr or ICl, a metal halide such as $FeCl_3$, $CuCl_2$, $BF_4$, or $AsF_5$, an acid such as sulfuric acid, nitric acid, or phosphoric acid, and alkali metal and alkaline earth metal such as Li, Na, K, Mg, or Ca.

The interlayer distance of the multilayer graphene 1 itself is 0.335 nm. However, by disposing the interlayer substance 2 between the layers of the graphene sheets, the interlayer distance of the multilayer graphene 1 becomes larger than 0.335 nm. The interlayer distance (average value) of the multilayer graphene 1 including the interlayer substance 2 between the layers thereof depends on a kind and an interlayer abundance ratio of the interlayer substance 2, but is typically 0.7 nm to 1.0 nm.

The side surface of the multilayer graphene 1 is connected to the organic compound layer 20. The side surface connected to the organic compound layer 20 is a side surface of the multilayer graphene 1 in a longitudinal direction, that is, a surface formed of an edge of the multilayer graphene. The side surface in a longitudinal direction and the organic compound layer 20 facing each other are preferably connected to each other. The organic compound layer 20 is disposed at least in a part of stacked surfaces. A metal film, a compound film, or the like may be formed on a stacked surface not having the organic compound layer 20 disposed thereon. A part of the stacked surfaces may be connected to other wiring. The organic compound layer 20 is disposed on one side surface or both side surfaces of the multilayer graphene 1.

The organic compound layer 20 is a layer of an organic group containing a photoisomerizable functional group. The photoisomerizable functional group may be one or more of azobenzene, stilbene, alkene, and the like. For example, the organic group is connected via an oxygen atom, to a carbon atom on an edge of graphene sheets. The graphene sheets on a side surface of the multilayer graphene 1 in a short direction, the uppermost surface, or the lowermost surface may be connected to a terminal or an electrode, for example, of a semiconductor device. An organic group containing azobenzene is isomerized (photoisomerized) from a cis form to a trans form, or from a trans form to a cis form by irradiation with ultraviolet rays. The organic group of the embodiment is bent with a photoisomerizable functional group as the center when seen from a whole structure of the organic group in order to prevent the interlayer substance 2 from being leaked. Whether the organic group is bent or not is determined in the following manner. That is, when a cis form and a trans form are compared with each other, it is assumed that the from having a larger bending angle with the photoisomerizable functional group as the center is a form bent with the photoisomerizable functional group as the center.

The organic group will be more specifically described using a cis form as an example.

The organic group containing azobenzene as a photoisomerizable functional group is, for example, cis form azobenzene. For example, a structure of the azobenzene (X and Y in a chemical formula below) includes an electron-donating group. The organic group may partly contain a trans form organic group. The organic group connected to the graphene sheets of the embodiment, for example, has a structure shown in Chemical Formula 1 below.

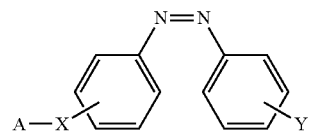

[Chemical Formula 1]

In Chemical Formula 1, "A" represents an oxygen atom or a coupling reaction product which is a linker between carbon atoms of the graphene sheets and "X".

In Chemical Formula 1, "X" represents a chain compound. Specifically, "X" preferably includes any polymer of polyethylene, polyfluoroethylene, polysiloxane, polyacetylene, and polyfluoroacetylene, or a copolymer obtained by combining these polymers. The total number of repeating unit of these polymers is, for example, 3 or more and 20 or less. When the chain compound is too short, undesirably, an effect of preventing the interlayer substance 2 from being leaked is lowered. When the chain compound is too long, undesirably, a reaction between the organic group and the graphene sheets hardly proceeds due to steric hindrance, and a photoisomerization reaction hardly proceeds. An organic group having a molecular structure of a self-assembled monomolecular film can be used as "X". Preferably, the chain compound does not contain a side chain because of the above-described reason.

In Chemical Formula 1, "Y" is represented by "W"-"Z". "W" is the above-described chain compound. "Z" represents a hydrogen atom, a halogenated alkyl group (carbon number including a side chain is 1 to 4, and halogen is any one of chlorine, fluorine, and bromine), or a hydrocarbon group such as alcohol (carbon number of 1 to 4).

A edge ("Z") of the organic group preferably has a charge opposite to the interlayer substance 2. In this case, it is considered that the tip of the organic group and the multilayer graphene 1 are electrically attracted to each other and a cis form is thereby stabilized.

The compound of Chemical Formula 1 is a cis form azobenzene compound. However, the organic compound layer 20 may include trans form azobenzene.

The photoisomerizable stilbene is, for example, cis form stilbene. A structure of the stilbene ("X" and "Y" in Chemical Formula below) includes an electron-donating group. The organic group may partly contain a trans form organic group. The organic group connected to the graphene sheets of the embodiment, for example, has a structure shown in Chemical Formula 2 below. For example, $R_1$ and $R_2$ each represent a hydrogen atom or a methyl group. "A", "X", and "Y" are common to those of azobenzene, and therefore, description thereof will be omitted.

[Chemical Formula 2]

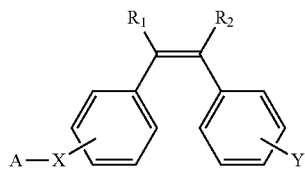

The photoisomerizable alkene is, for example, cis form alkene. A structure of the alkene (X and Y in Chemical Formula below) includes an electron-donating group. The organic group may partly contain a trans form organic group. The organic group connected to the graphene sheets of the embodiment, for example, has a structure shown in Chemical Formula 3 below. "A", "X", "Y", $R_1$, and $R_2$ are common to those of azobenzene and stilbene, and therefore, description thereof will be omitted.

[Chemical Formula 3]

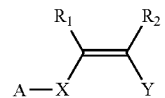

Some specific examples of the organic group are illustrated below. In the formulae, GR represents a graphene. The following groups are examples of a p-azobenzene type organic group. The stilbene type photoisomerizable compound or the alkene type photoisomerizable compound is also used similarly to the following specific examples.

[Chemical Formula 4]

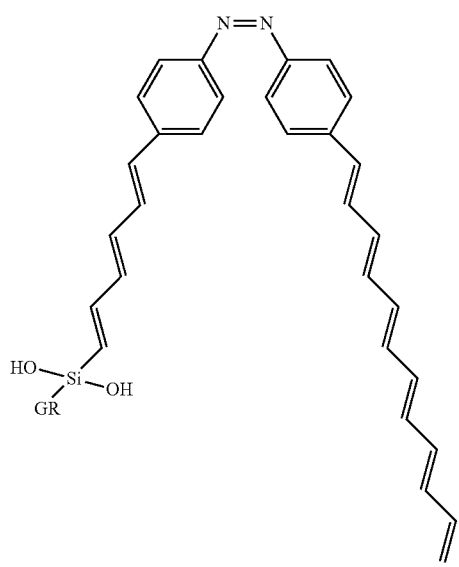

[Chemical Formula 5]

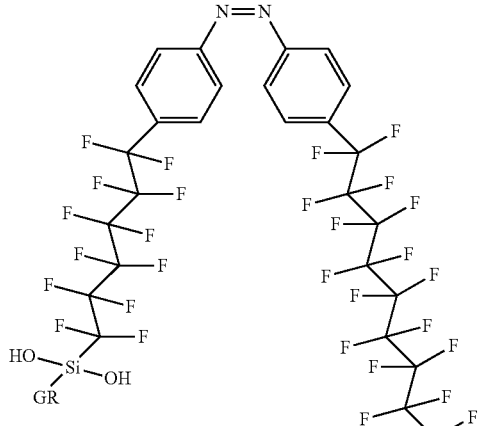

[Chemical Formula 6]

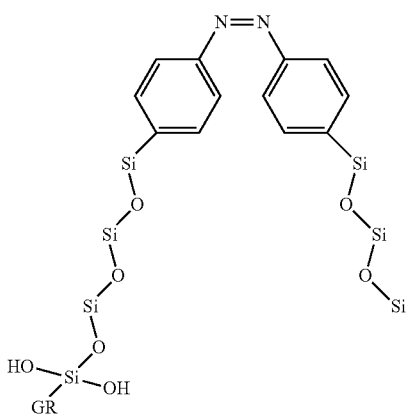

Figure 2:
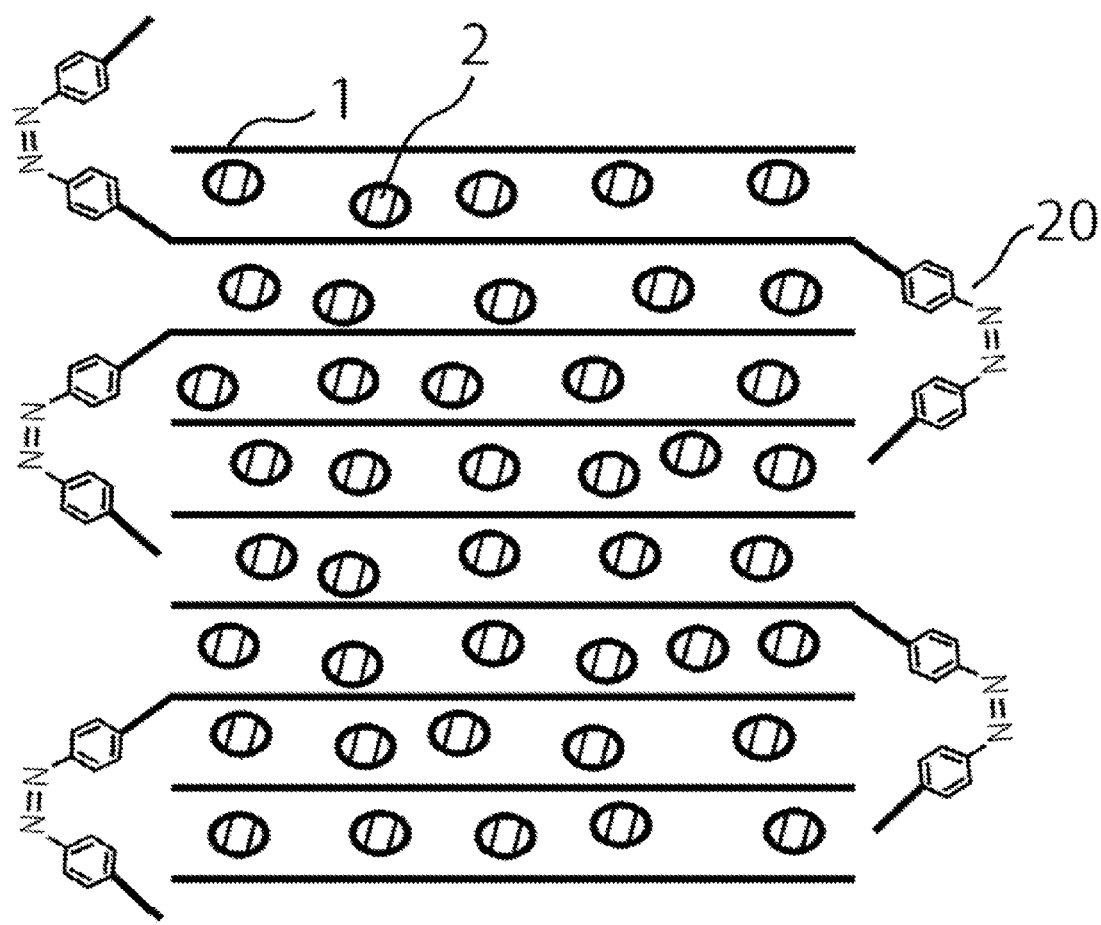
FIG. 2 is a cross sectional schematic diagram of the wiring according to the embodiment.

FIG. 2 illustrates a cross sectional schematic diagram of the wiring of the embodiment. In FIG. 2, the interlayer substance 2 is inserted between the layers of the multilayer graphene 1. An edge of the multilayer graphene 1 includes the organic compound layer 20 having a structure bent with the photoisomerizable functional group as the center. Due to existence of the organic compound layer 20, the interlayer substance 2 is hardly leaked (cannot be leaked) from the multilayer graphene 1.

Next, a method for manufacturing the wiring 100 of the embodiment will be described.

The method for manufacturing the wiring 100 of the embodiment includes forming a multilayer graphene processed into a wiring pattern shape on a substrate (first process), forming an organic compound layer on a side surface of the multilayer graphene in a longitudinal direction (second process), inserting an interlayer substance into the multilayer graphene having the organic compound layer formed therein (third process), and cis-trans isomerizing an organic group in the organic compound layer (fourth process). Hereinafter, the manufacturing method will be described with reference to the schematic diagrams of the processes in the method for manufacturing the wiring 100 of the embodiment, illustrated in FIGS. 3 to 9.

Figure 3:
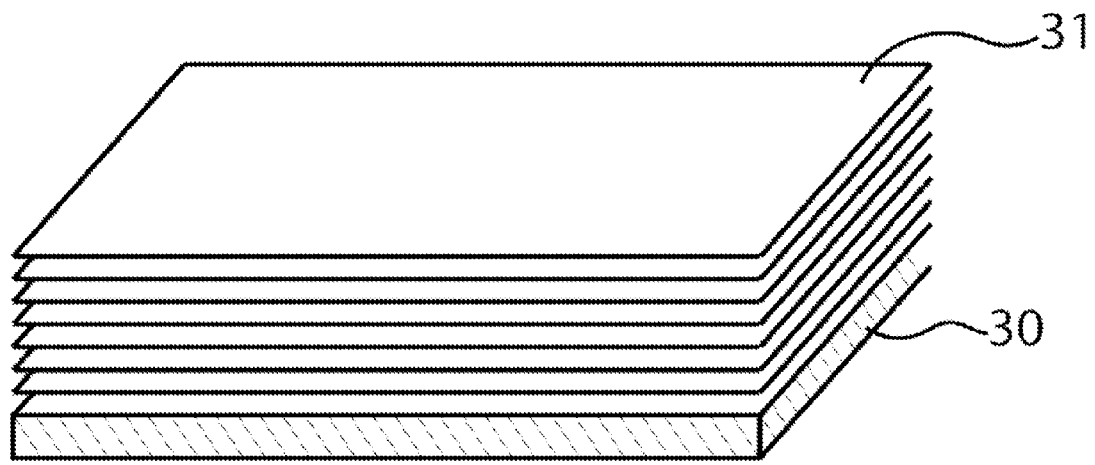
FIG. 3 is a schematic diagram of a process in a method for manufacturing the wiring according to the embodiment.
Figure 4:
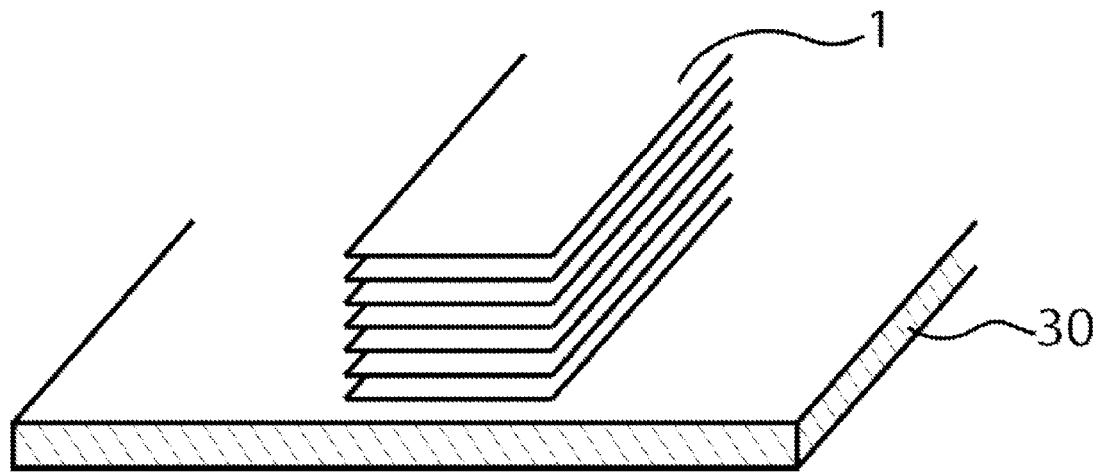
FIG. 4 is a schematic diagram of a process in the method for manufacturing the wiring according to the embodiment.

First, the first process of forming a multilayer graphene processed into a wiring pattern shape on a substrate will be described. FIG. 3 illustrates a schematic diagram of a process for forming a multilayer graphene 31 on a substrate 30. FIG. 4 illustrates a schematic diagram of a process for processing the multilayer graphene 31 formed on the substrate 30 into a wiring pattern shape. When a multilayer graphene processed into a wiring pattern shape is formed on the substrate 30, for example, the following methods are used. That is, after the multilayer graphene 31 is formed on the substrate 30, the multilayer graphene 31 is processed into a wiring pattern shape to form the multilayer graphene 1 processed into a wiring pattern shape. Alternatively, the multilayer graphene 1 processed into a wiring pattern shape is transcribed onto the substrate 30. The method for forming the multilayer graphene 31 on the substrate 30 is as follows. That is, a multilayer graphene manufactured in advance for transcription is transcribed onto the substrate 30. Alternatively, a catalytic film made of nickel or the like is formed on the substrate 30, hydrocarbon gas is supplied thereto, and the multilayer graphene 31 can be formed by a chemical vapor deposition method. A catalytic film may be formed in accordance with a wiring pattern in advance, and a multilayer graphene may be formed on the catalytic film to thereby form the multilayer graphene 1 processed into a wiring pattern shape. As the method for processing the multilayer graphene 31 into a wiring pattern shape, a well-known lithography technology or the like can be used. The layer number and the wiring shape of the multilayer graphene 1 are adjusted in this process. When a metal film or a compound film is partly formed on a side surface of the multilayer graphene 1 in a longitudinal direction, the metal film or the compound film is preferably formed between the first process and the second process.

Figure 5:
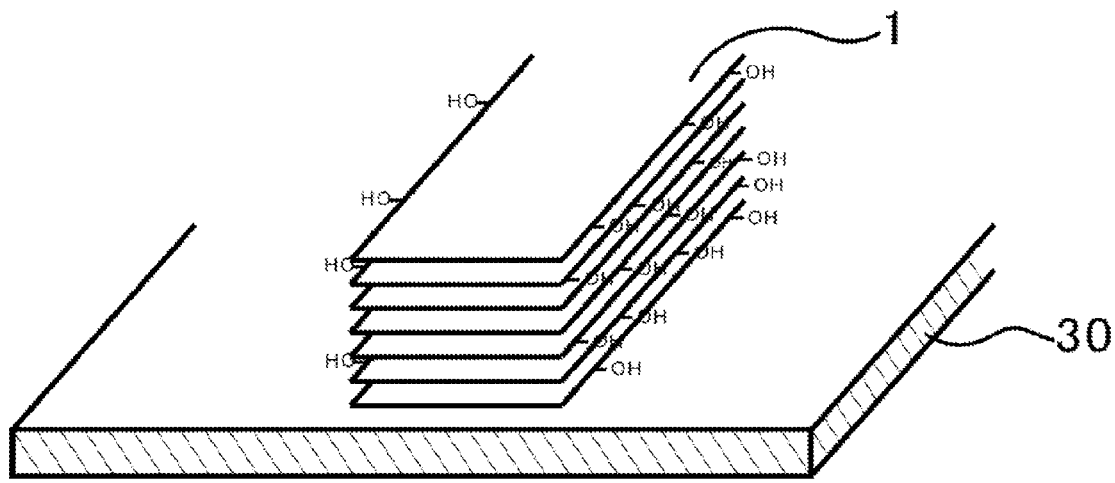
FIG. 5 is a schematic diagram of a process in the method for manufacturing the wiring according to the embodiment.
Figure 6:
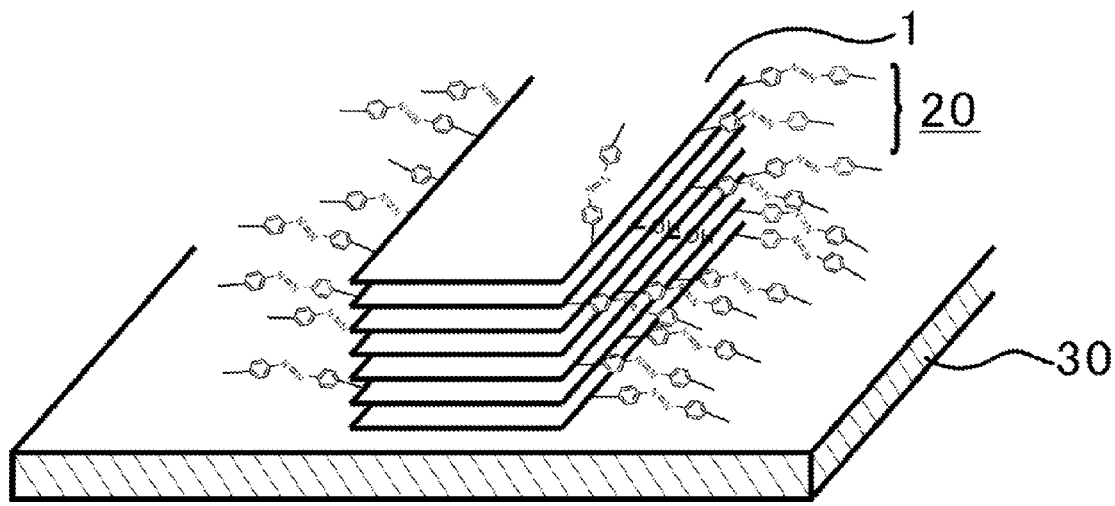
FIG. 6 is a schematic diagram of a process in the method for manufacturing the wiring according to the embodiment.

Next, the second process of forming an organic compound layer on a side surface of the multilayer graphene in a longitudinal direction will be described. FIG. 5 illustrates a schematic diagram of a process for introducing a hydroxyl group to an edge of the multilayer graphene 1. FIG. 6 illustrates a schematic diagram of a process for forming the organic compound layer 20 by reacting a compound containing a photoisomerizable organic group with a hydroxyl group of the multilayer graphene 1.

In the process illustrated in FIG. 5, an oxygen atom is introduced to a carbon atom on an edge of the graphene sheets included in the multilayer graphene 1. A graphene has a stable carbon skeleton structure except for a defect. Therefore, in order to introduce an organic group, a functional group is preferably introduced to the carbon atom on the edge of the graphene sheets. In FIG. 5, a hydroxyl group is introduced. However, a group to be introduced is not limited to the hydroxyl group. A carboxyl group or the like may be introduced to the carbon atom on the edge. Any one or more functional groups such as a hydroxyl group or a carboxyl group are selected appropriately in accordance with a functional group of an organic group to be introduced. In this process, the introduction of the organic group is described using a silane coupling agent as an example. Therefore, a hydroxyl group is introduced to the carbon atom on the edge. A hydroxyl group or the like may be introduced to the carbon atom on the edge by etching performed when a wiring pattern of the multilayer graphene 1 is formed. The process illustrated in FIG. 5 may be omitted.

Examples of a method for introducing a hydroxyl group or a carboxyl group to the carbon atom on the edge include a method for treating the multilayer graphene 1 with potassium chlorate and fuming nitric acid, a method for treating the multilayer graphene 1 with sulfuric acid, sodium nitrate, and potassium permanganate, a method for treating the multilayer graphene 1 with concentrated sulfuric acid, a method for treating the multilayer graphene 1 with a piranha solution, and a method for treating the multilayer graphene 1 with oxygen plasma. In any treatment described above, the carbon atom on the edge is easily oxidized because an outer side (edge) of the graphene sheets includes more defects in the skeleton structure than an inner side thereof. When surfaces of the stacked graphene sheets, a metal film, a semiconductor device, or the like is damaged in these treatments, in order to protect these from an acid treatment, parts other than the side surface of the multilayer graphene 1 in a longitudinal direction may be protected using a mask for thin line (wiring) patterning.

In the process illustrated in FIG. 6, a compound containing a photoisomerizable organic group is reacted with the carbon atom on the edge of the graphene sheets. In this reaction, a high reactive functional group bonded to the carbon atom on the edge is bonded to the compound containing a photoisomerizable organic group. This reaction is, for example, a silane coupling reaction or a condensation reaction. Examples of the compound containing a photoisomerizable organic group include a silane coupling agent containing a photoisomerizable organic group, an alcohol, an aluminate, and a titanate, and are not particularly limited as long as the compound has a high reactivity with a functional group introduced to the carbon atom on the edge. As illustrated in FIG. 6, the hydroxyl group or the carboxyl group may partly remain without reacting with the compound containing a photoisomerizable organic group.

Figure 7:
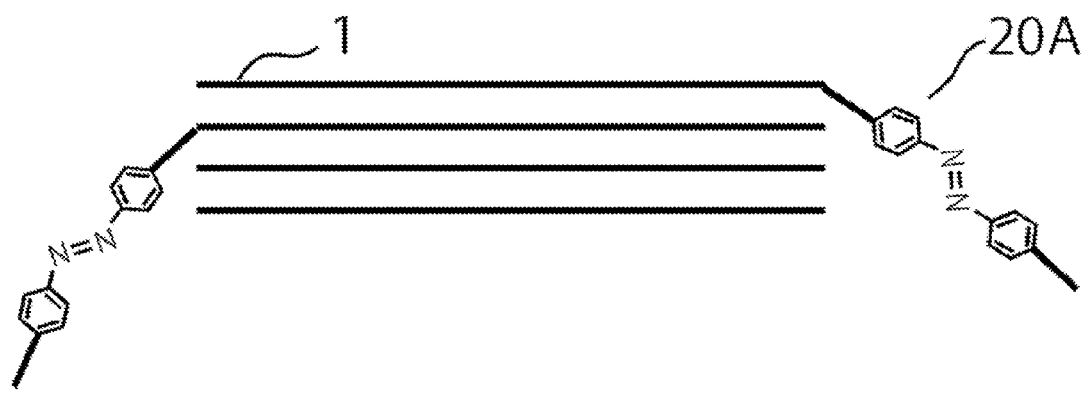
FIG. 7 is a schematic diagram of a process in the method for manufacturing the wiring according to the embodiment.
Figure 8:
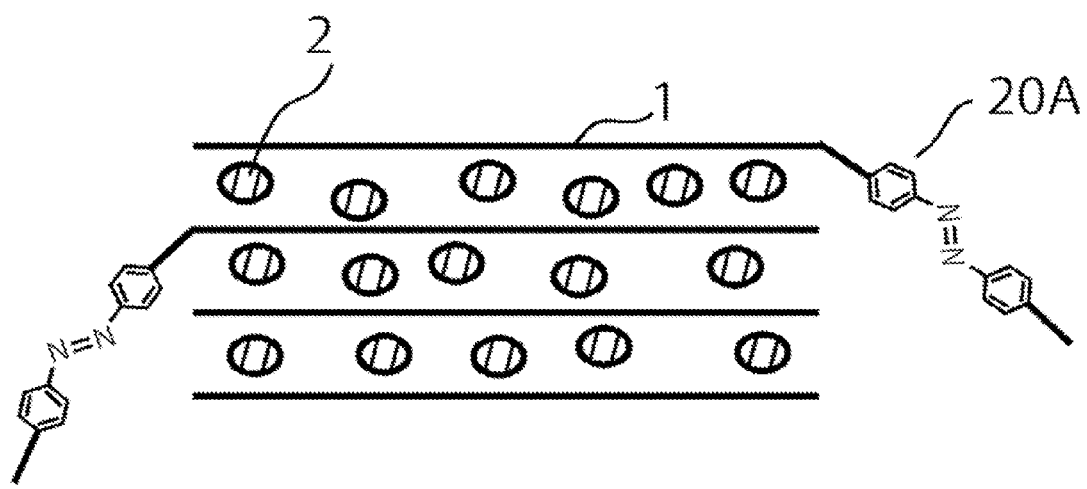
FIG. 8 is a schematic diagram of a process in the method for manufacturing the wiring according to the embodiment.

Next, the third process of inserting the interlayer substance 2 between the layers of the multilayer graphene 1 having the organic compound layer 20 formed therein. FIGS. 7 and 8 illustrate schematic diagrams of processes for inserting the interlayer substance 2 between the layers of the multilayer graphene 1. FIG. 7 is a schematic diagram of a process before the interlayer substance 2 is inserted. In FIG. 7, an organic compound layer containing an unbent organic group is represented by a reference sign 20A. FIG. 8 is a schematic diagram of a process after the interlayer substance 2 is inserted. The interlayer substance 2 is inserted between the layers of the multilayer graphene 1 with a gas atmosphere including, as a raw material, one or more atoms or molecules selected from halogen such as $F_2$, $Cl_2$, $Br_2$, or $I_2$, an interhalogen compound such as IBr or ICl, a metal halide such as $FeCl_3$, $CuCl_2$, $BF_4$, or $AsF_5$, an acid such as sulfuric acid, nitric acid, or phosphoric acid, and alkali metal and alkaline earth metal such as Li, Na, K, Mg, or Ca. This treatment is preferably performed by heating because the interlayer substance 2 is sometimes hardly inserted between the layers of the multilayer graphene 1 due to the organic compound layer 20.

Figure 9:
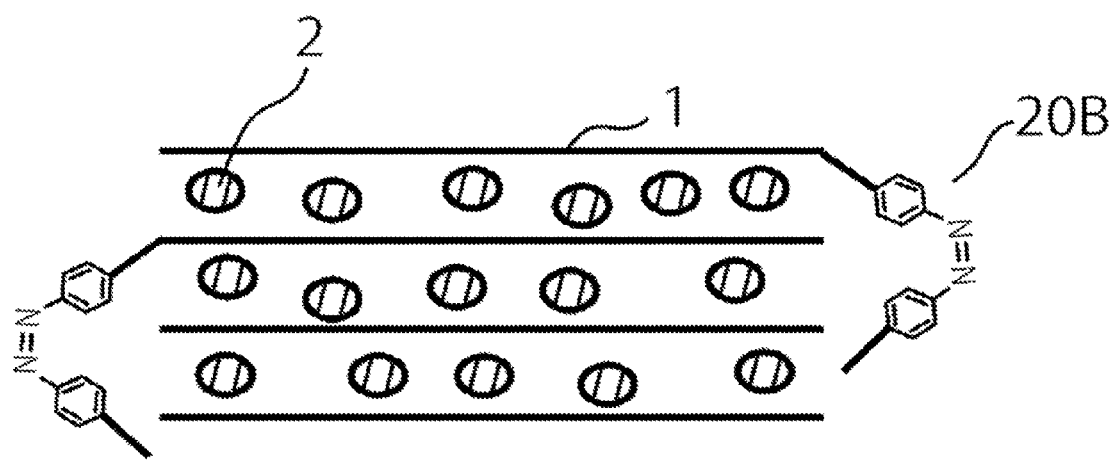
FIG. 9 is a schematic diagram of a process in the method for manufacturing the wiring according to the embodiment.

Next the fourth process of cis-trans isomerizing an organic group in the organic compound layer 20 will be described. FIG. 9 represents a schematic diagram of a process for photoisomerizing an organic group. In FIG. 9, an organic compound layer containing a bent organic group is represented by a reference sign 20B. The organic group includes photoisomerizable azobenzene, stilbene, and alkene. Therefore, a cis-trans isomerization reaction occurs by irradiation with light. A preferable range of a wavelength of light for irradiation depends on the organic group, but is typically from a visible light region to an ultraviolet region. For example, the photoisomerization reaction occurs by light in the visible light region, the treatment for the process is preferably performed in a visible light shielding state from the introduction of the organic compound layer 20 until this process or until a light shielding film is formed on the wiring.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. Wiring comprising:
a multilayer graphene including graphene sheets;
an interlayer substance disposed between layers of the multilayer graphene; and
an organic compound layer connected to an edge of a side surface of the multilayer graphene, wherein
the organic compound layer contains an organic group including at least one of azobenzene, stilbene, and alkene connected to the edge of the side surface of the multilayer graphene,
a length of the organic group is longer than an interlayer distance of the multilayer graphene,
the length is a distance from one end of the organic group to the other end of the organic group,
the graphene sheets are stacked, and
the organic group strides over at least one of the stacked graphene sheets.

2. The wiring according to claim 1, wherein
the organic group has a structure shown in Chemical Formula 1 below,
in Chemical Formula 1,
"A" represents an oxygen atom or a coupling reaction product which is a linker between carbon atoms of the graphene sheets of the multilayer graphene and "X",
"X" represents a chain compound, and
"Y is represented by "W"-"Z", "W" representing a chain compound, and "Z" representing at least one of a hydrogen atom, a halogenated alkyl group, and alcohol,

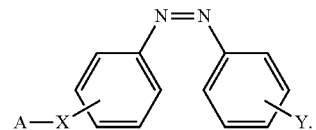

(Chemical Formula 1)

3. The wiring according to claim 1, wherein
the interlayer substance is one or more selected from $F_2$, $Cl_2$, $Br_2$, $I_2$, IBr, ICl, $FeCl_3$, $CuCl_2$, $BF_4$, $AsF_5$, sulfuric acid, nitric acid, phosphoric acid, Li, Na, K, Mg, and Ca.

4. The wiring according to claim 1, wherein the organic group is bent with one of azobenzene, stilbene, and alkene as the center.

5. The wiring according to claim 1, wherein the organic group is connected to an edge of the graphene sheets included in the multilayer graphene via an oxygen atom.

6. The wiring according to claim 1, wherein the organic group includes an electron-donating group.

7. The wiring according to claim 2, wherein X is any polymer of polyethylene, polyfluoroethylene, polysiloxane, polyacetylene, and polyfluoroacetylene, or a copolymer obtained by combining the polymers.

8. The wiring according to claim 2, wherein Z has a charge opposite to the interlayer substance.

9. The wiring according to claim 7, wherein the total number of repeating unit of the polymer or the copolymer of X is 3 or more and 20 or less.

10. The wiring according to claim 2, wherein "X" is a chain compound not containing a side chain.

11. The wiring according to claim 1, wherein the organic compound layer is connected to a side surface of the multilayer graphene in a longitudinal direction.

12. The wiring according to claim 1, wherein the organic group is a photoisomerizable organic group.

13. The wiring according to claim 1, wherein the interlayer substance exists between the graphene sheets which are stridden over by the organic group.

14. The wiring according to claim 1, wherein
the one end of the each organic group is bonded to the edge of one of the graphene sheets, and
the other end of the organic group is a free end.

* * * * *